United States Patent [19]
Lehman et al.

[11] Patent Number: 5,214,498
[45] Date of Patent: May 25, 1993

[54] MMIC PACKAGE AND CONNECTOR

[75] Inventors: George R. Lehman, Port Jones; Stacey M. Bilski; Steven W. Miller, both of Santa Barbara, all of Calif.

[73] Assignee: Raytheon Company, Lexington, Mass.

[21] Appl. No.: 789,393

[22] Filed: Nov. 7, 1991

Related U.S. Application Data

[63] Continuation of Ser. No. 626,374, Dec. 12, 1990, abandoned, which is a continuation of Ser. No. 485,359, Feb. 26, 1990, abandoned.

[51] Int. Cl.$^5$ ............... H01L 23/02; H01L 23/48
[52] U.S. Cl. ............................. 257/678; 257/724; 257/701
[58] Field of Search ............... 357/74, 72, 81; 333/246, 247

[56] References Cited

U.S. PATENT DOCUMENTS

| | | | |
|---|---|---|---|
| 4,085,390 | 4/1978 | Standing | 333/247 |
| 4,259,684 | 3/1981 | Dean et al. | 333/247 |
| 4,288,841 | 9/1981 | Gogal | 357/75 |
| 4,458,222 | 7/1984 | Herstein et al. | 333/247 |
| 4,479,100 | 10/1984 | Moghe et al. | 333/246 |
| 4,551,747 | 11/1985 | Gilbert et al. | 357/80 |
| 4,626,805 | 12/1986 | Jones | 333/246 |
| 4,649,416 | 3/1987 | Borkowski et al. | 357/75 |
| 4,821,007 | 4/1989 | Fields et al. | 333/238 |
| 4,839,717 | 6/1989 | Phy et al. | 357/74 |
| 4,879,588 | 11/1989 | Ohtsuka et al. | 357/74 |
| 4,890,195 | 12/1989 | Heckaman et al. | 357/81 |
| 4,899,118 | 2/1990 | Polinski, Sr. | 333/247 |
| 4,901,041 | 2/1990 | Pengelly | 357/80 |
| 4,951,014 | 8/1990 | Wohlert et al. | 333/246 |
| 4,967,201 | 10/1990 | Rich, III | 357/81 |
| 4,972,253 | 11/1990 | Palino et al. | 357/74 |
| 4,985,753 | 1/1991 | Fujioka et al. | 351/74 |
| 5,023,703 | 6/1991 | Hidaka et al. | 357/74 |

FOREIGN PATENT DOCUMENTS

| | | | |
|---|---|---|---|
| 0275973 | 7/1988 | European Pat. Off. | |
| 2616963 | 12/1988 | France | 357/74 |
| 55-91152 | 7/1980 | Japan | 357/74 |
| 63-257255 | 10/1988 | Japan | 357/74 |

OTHER PUBLICATIONS

Fuminori Ishitsuka et al., "Low Cost, High-Performance Package for a Multi-Chip MMIC Module" 1988, New York, Technical Digest of the IEEE Gallim Arsenide Integrated Circuit Symposium, pp. 221–224.

*Primary Examiner*—Eugene R. LaRoche
*Assistant Examiner*—Viet Q. Nguyen
*Attorney, Agent, or Firm*—William R. Clark; Richard M. Sharkansky

[57] ABSTRACT

A package for electronic components, especially MMIC components, is disclosed. The package is constructed from layers of ceramic cofired to form an annular piece. Metal pieces are brazed onto the top and bottom of the annular piece to hermetically seal the package. Certain of the ceramic pieces are coated with patterns of conductive material before cofiring. The conductive material forms DC power distribution lines to electronic components within the package and low loss RF feedthroughs into the package.

4 Claims, 3 Drawing Sheets

MMIC PACKAGE AND CONNECTOR

This application is a continuation of application Ser. No. 626,374 filed Dec. 12, 1990 which is a continuation of Ser. No. 485,359 filed Feb. 26, 1990 now abandoned.

BACKGROUND OF THE INVENTION

This invention relates generally to high frequency components and more particularly to packaging for high frequency components.

Monolithic microwave integrated circuits (MMIC) are becoming prevalent in microwave frequency communications systems. MMIC components are fabricated using techniques similar to those used to fabricate semiconductor circuits. The resulting circuits are thus very small. For example, an amplifier and a phase shifter fabricated using MMIC technology might both fit into a package with dimensions approximately $0.5'' \times 0.5'' \times 2''$.

MMIC components must be adequately packaged. The package, at a basic level, provides physical support for the component. Beyond that, the package also provides an hermetically sealed environment. Since the MMIC components have both RF and DC inputs, the package must accommodate two types of connections to the MMIC components.

Some MMIC packages are made with metal walls. A metal top and bottom are then brazed to the walls. Coaxial connectors run through the walls for RF connections and pins are placed through the walls for DC connections. Inside the package, flexicables are used to make connections to the MMIC components.

In another type of package, the walls are made from several layers of ceramic which is cofired to make a laminated ceramic wall. In some instances, conductive traces are deposited onto the separate ceramic layers before cofiring to pass RF and DC signals through the walls. Inside the package, flexicables complete the RF and DC connections to the MMIC components. The signal paths through the walls can be made by silk screening tungsten paste onto the ceramic.

While these laminated packages are adequate for many applications, it would be desirable to improve their construction. It might be desirable to simplify assembly of the package by eliminating the flexicable. Also, it might be desirable to reduce the lossiness of the RF feedthrough.

SUMMARY OF THE INVENTION

With the foregoing background of the invention in mind, it is an object of this invention to provide a simplified MMIC package.

It is also an object to provide a package wherein both RF and DC signals can be coupled to a MMIC chip without flexicable inside the package.

It is further an object to provide a package having a low loss RF feed-through.

The foregoing and other objects are achieved in a package with walls made from a plurality of ceramic layers. Tungsten paste is deposited in traces on some of the ceramic layers to make RF and DC feed-throughs. The tungsten paste regions extend along a first ceramic layer adjacent the MMIC components. Overlaying ceramic layers have holes formed therethrough which are filled with conductive tungsten paste. These traces carry DC power and power connections to the MMIC components and are made by wire bonds to the tungsten in the holes. The layer with the DC power trace extends beyond the other layers in certain regions. The walls of the package are gold plated, including the extending regions of the DC power trace, thereby reducing the resistance of the DC power trace.

According to another feature of the invention, the traces are used to make the RF feed-through vary in width. The width is less where the trace on one layer is disposed below another layer, to provide uniform impedance along the RF trace. Additionally, certain ones of the layers have aligned holes formed through them. The holes are formed adjacent the RF trace. These holes are filled with tungsten paste, forming bars of tungsten adjacent the RF trace which have the electrical effect of walls of a waveguide. The bars isolate the RF and DC signals passing through the walls of the package. Also, the bars block the excitation of RF modes in the ceramic walls of the package.

BRIEF DESCRIPTION OF THE DRAWINGS

The invention will be understood by reference to the following more detailed description and accompanying figures in which.

DESCRIPTION OF THE PREFERRED EMBODIMENT

Figure 1:
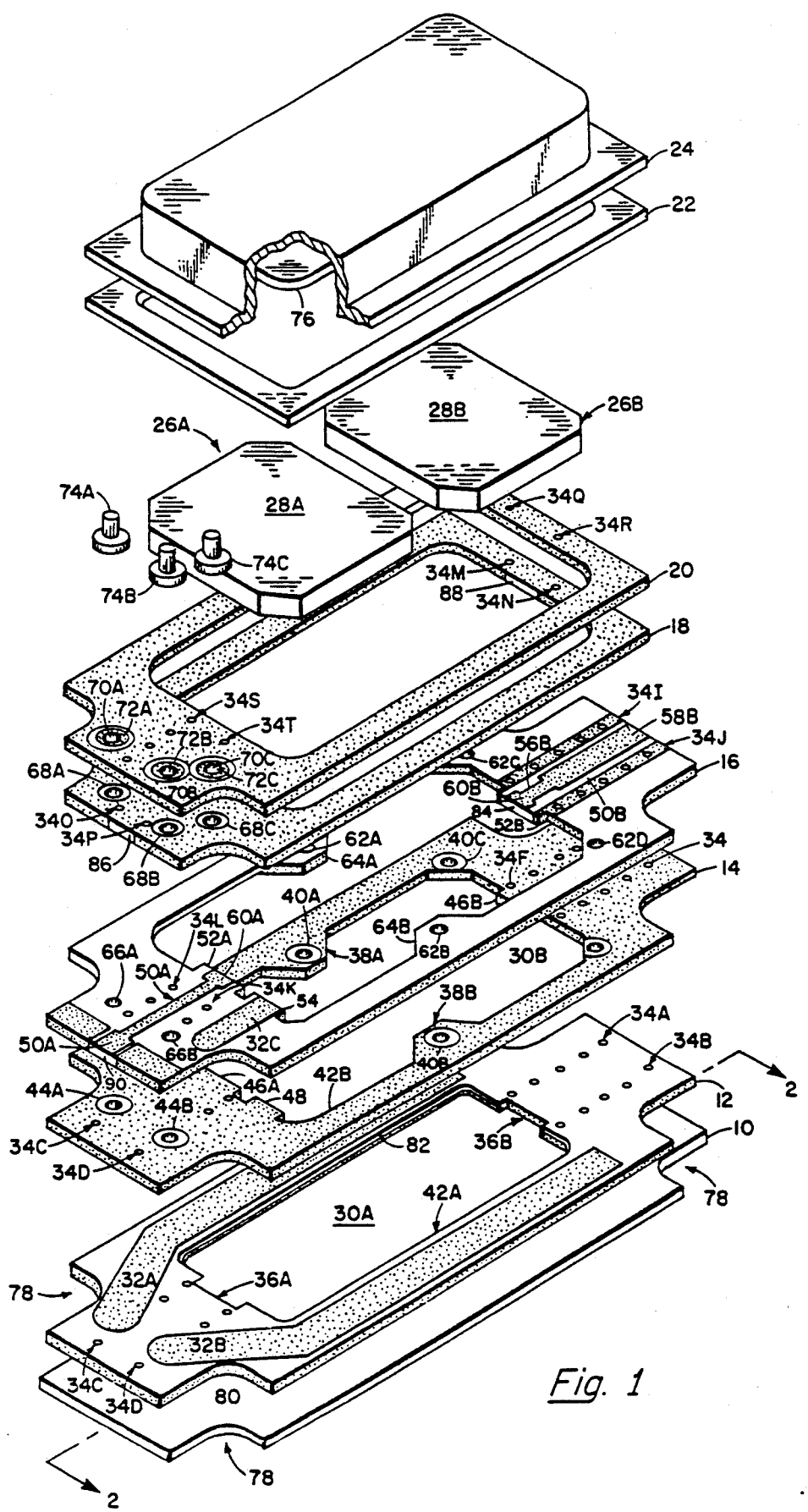
FIG. 1 is an exploded view of a package constructed according to the present invention with a portion of the lid cut away.

FIG. 1 shows an exploded view of a package made according to the invention. The package as shown encloses two Monolithic Microwave Integrated Circuit (MMIC) chips 26A and 26B. Microwave circuitry—such as amplifiers and phase shifters—is fabricated on upper surfaces 28A and 28B using known techniques. In many instances, MMIC chips are actually mounted on metal chip carriers. (Hereafter, the term MMIC chip will be used to refer to the MMIC chip and any carrier or mechanical means to support the chip.)

The walls of the package are made from several layers, here five, of ceramic. Here, 92% purity Al$_2$O$_3$ (alumina) is used. A suitable material is available from the Kyocera Company as product no. NO.A473. The ceramic is patterned while in the green state into the shapes shown to form layers 12, 14, 16, 18 and 20. In the green state, the raw state before firing, the ceramic material is pliable and can be easily shaped. Layers 12, 14, 16, 18 and 20 each have an opening 30A, 30B, 30C, 30D and 30E, respectively, formed in them. When layers 12, 14, 16, 18 and 20 are connected together, the openings 30A-30E create an opening into which MMIC chips 26A and 26B fit.

Before the layers 12, 14, 16, 18 and 20 are connected, holes are drilled or punched in the layers and metal is deposited in selected regions. (Hereafter, the term "drilled" will be used to refer to any known method of forming holes.) The metal, here tungsten, is deposited in paste form using a process known as silk screening.

Layer 12 has patterned on it metal in selected regions to form DC traces 32A and 32B. As will be described below, DC traces 32A and 32B carry DC power at two different voltage levels to MMIC chips 26A and 26B. Four rows of holes 34A, 34B, 34C and 34D are drilled through layer 12. It will be noted that where DC traces 32A and 32B intersect a row of holes, no holes are drilled. Each of the holes in row of holes 34A is filled with metal during the silk screening process.

Layer 14 is formed with a slightly different shape than layer 12. Layer 14 has tabs 38A and 38B with holes 40A and 40B formed therethrough. When layer 14 is connected to layer 12, tabs 38A and 38B will be partially above DC traces 32A and 32B. Holes 40A and 40B will be above DC traces 32A and 32B. Holes 40A and 40B are filled with metal paste during the silk screening operation to provide electrical connections to DC traces 32A and 328. Likewise, holes 40C and 40D provide an electrical connection to DC traces 32A and 32B.

It should be noted that side walls 42A of layer 12 are wider than side walls 42B of layer 14. Thus, when layer 14 is connected to layer 12, portions of traces 32A and 32B will be under side walls 42B of layer 14, but a portion of DC traces 32A and 32B will extend beyond side walls 42B. This arrangement becomes significant at a latter step in the manufacturing process because it allows portions of DC traces 32A and 32B to be gold plated, drastically reducing their resistance.

Layer 14 has formed therethrough holes 44A and 44B. Holes 44A and 44B are above DC traces 32A and 32B, respectively. Holes 44A and 44B are filled with tungsten paste during the silk screening step, thereby providing an electrical connection to DC traces 32A and 32B through layer 14.

Layer 14, like layer 12, contains four rows of holes 34E-34H. Where holes 44A and 44B overlap with rows 34G and 34H, no holes are drilled. Each hole in rows 34E-34H in layer 14 is above one of the holes in rows 34A-34D in layer 12. When the holes in rows 34E-34H are filled with metal paste during the silk screening step, conducting paths are formed through both layers 12 and 14 to base 10.

Virtually all of the surface of layer 14 is covered with tungsten during the silk screening step. This coating of tungsten is electrically connected to base 10 via rows of holes 34A-34H. Base 10 is the package ground. Thus, the upper surface of layer 14 functions as a ground plane. The upper surface layer 14 is connected to ground through a redundant path, described below, to ensure that it is adequately grounded. Small regions around holes 44A, 44B, 40A, 40B, 40C and 40D are not covered by tungsten. These regions ensure that the tungsten paste in the various holes is not shorted together or to the ground plane.

Layer 16 contains RF traces 50A and 50B which are formed during the silk screening step. Here, RF trace 50A is the RF input and RF trace 50B is the output. Each RF trace has a portion forming system connection pads 58A and 58B. As will be described below, when layer 18 is connected to layer 16, system connection pads 58A and 58B will extend beyond layer 18 providing a place for an RF connection.

Second portions of RF traces 50A and 508 form chip connection pads 60A and 60B. When the package is fully assembled, the upper surfaces of chips 28A and 28B will be at the same level as chip connection pads 60A and 60B. Since chip connection pads 60A and 60B are formed on tabs 52A and 52B, respectively, the pads extend beyond layers 18 and 20. Thus, the RF signal path can be easily extended from RF traces 50A and 50B to circuitry on chips 28A and 28B. For example, chips 28A and 28B can be connected to chip connection pads 60A and 60B with gold mesh ribbon bonded to pads 60A and 60B.

Silk screened onto layer 16 is DC trace 32C. DC trace 32C has a portion disposed on tab 54. This portion extends beyond layers 18 and 20, allowing easy connection of DC trace 32C to chip 28A. Thus, a third DC voltage level can be brought onto chip 28A. Jumpers between chips 28A and 28B can carry this same voltage to chip 28B. For example, gold wire can be bonded to form the connection.

Layer 16, like layers 12 and 14, contains four rows of holes 34I-34L. The holes in these rows align with the holes in rows 34E-34H. The holes in rows 34I-34L are likewise filled with tungsten paste during the silk screening step, thereby continuing the conductive paths through layer 16.

Layer 16 contains tabs 64A and 64B, which are aligned over tabs 38A and 38B. Holes 62A and 62B through tabs 64A and 64B align with holes 40A and 40B. Holes 62A and 62B are filled with tungsten paste, thereby providing conducting paths through holes 62A, 62B, 40A and 40B to DC traces 32A and 32B. In the assembled package, the surfaces 28A and 28B of chips 26A and 26B is at the same level as the surface of tabs 64A and 64B. Thus, DC connections can be easily made to chips 28A and 28B by bond wires (not shown) from the tungsten in holes 62A and 62B to the surface of chips 28A and 28B. In a similar fashion, DC connections can be made through holes 62C and 62D.

Layer 16 contains holes 66A and 668 therethrough. These holes align with holes 44A and 44B. When filled with tungsten, holes 66A and 66B continue the conducting path to DC traces 32A and 32B.

Layer 18 is above layer 16. Layer 18 is shorter than layers 12, 14 and 16. The shape allows system connection pads 58A and 58B to extend beyond layer 18.

Layer 18 contains holes 68A and 68B therethrough. These holes, when filled with tungsten, extend the conducting path to DC traces 32A and 32B through layer 18. Layer 18 also contains hole 68C which, when filled with tungsten, provides a conducting path to DC trace 32C.

Layer 18 contains rows of holes 34M through 34P. Holes in these rows align with holes in rows 34I-34L. However, there are fewer holes in rows 34M through 34P since layer 18 is shorter than layer 16. Where holes 68A and 68B overlap rows of holes 340 and 34P, holes are omitted from row of holes 340 and 34P.

The upper surface of layer 18 is almost entirely covered by tungsten during the silk screening step. This coating is electrically connected to base 10 through the conducting paths formed by tungsten in the holes of rows of holes 34I-34P. Thus, the upper surface of layer 18 forms a ground plane.

Layer 20 is similar to layer 18. It has holes 70A-70C aligned with holes 68A-68C. When filled with tungsten, they continue the conducting paths to DC traces 32A, 32B and 32C. Pin pads 72A-72C are formed from tungsten around holes 70A-70C. Pins 74A-74C are brazed to pin pads 72A-72C, thereby making electrical connection to the tungsten in holes 70A-70C. Since the tungsten in holes 70A-70C is part of conducting paths to DC traces 32A-32C, pins 74A-74C form the DC input terminals.

Layer 20 has formed therethrough rows of holes 34Q-34T. These holes align with the holes in rows of holes 34M-34P. The holes in rows of holes 34Q-34T are filled with tungsten during the silk screening step, thereby continuing the conductive paths formed by rows of holes 34A-34P.

Seal ring 22 is connected to layer 20. Seal ring 22 is made from metal such as kovar and is brazed to layer 20. Cover 24 is brazed to seal ring 22. A layer of microwave absorber 76 is included inside cover 24. Absorber 76 absorbs any radio frequency energy radiating from the circuits in chips 28A-28B.

The package of FIG. 1 is assembled by first forming each of layers 12, 14, 16, 18 and 20 from alumina. These components are formed while the alumina in the "green" state. Holes are then drilled in each layer as required. Alternatively, the holes can be formed when the alumina is molded. The tungsten is then silk screened onto layers while it is in paste form. Layers 12-20 are then clamped together and fired to form an annular piece. Small holes (not shown) can be drilled through layers 12-20 and alignment of all layers can be achieved by inserting a rod through these holes in all the layers.

Base 10 is made from copper tungsten for good heat dissipation. Seal ring 22 is formed from kovar. Base 10 and seal ring 22 are brazed onto the annular structure. Pins 74A-74C are likewise brazed in place. This brazing step serves also to braze the tungsten paste inside rows of holes 34A-34T.

The package is then gold plated to provide better RF performance, as is known in the art. However, a second advantage is achieved due to the novel structure of this package. During the gold plating, both the inside and outside of the package are coated. Thus, the tungsten traces which are exposed are also gold plated. For example, portions of DC traces 32A and 32B are exposed, these traces will be gold plated. Since gold has a much lower resistance than tungsten, DC traces 32A and 32B can carry much more current after they are plated. For example, DC traces can carry the several amps of current needed to operate the MMIC circuitry on chips 26A and 26B. Also, the DC traces run the length of the package which is approximately 1 to 2 inches in length. A higher resistance material could not be used for such a long run.

The gold plating adheres to the tungsten paste but not exposed ceramic. To pattern where the gold plating is adhered, the tungsten paste is selectively applied to the ceramic layers 12, 14, 16, 18, and 20.

As shown, both the inside and outside edges of the layers are gold plated except in a few selected places. As a result of this tungsten coating, these edges are gold plated during the gold plating operation. Thus, the package has the electrical characteristics of a gold walled package.

However, gold plating may not be applied over all the inside edges of the ceramic layers. On layer 12, there is a band 82 around the inside edge where no tungsten paste is applied. This band might result from the silk screening operation. Alternatively, the tungsten paste on the inside edges of layer 12 could be painted on with care to ensure that no tungsten paste is deposited in band 82.

Band 82 ensures that there is no gold plated or tungsten conducting path between DC traces 32A or 32B and base 10. Such a path would short the DC traces to ground. There must be a similar band (not shown) on the edge of tab 54 adjacent to DC trace 32C to prevent the shorting of that trace.

Band 82 continues around the entire inside edge of layer 12 with the exception of the walls of openings 36A and 36B. When assembled, the gold plated walls inside openings 36A and 36B provide a low resistance path from the package ground on layer 10 to the top of layer 12. A portion of this path will end at the bottom of tab 46A. However, a portion of this conducting path will contact the inside edge of layer 14 because tabs 46A and 46B are narrower than opening 36A and 36B. The inside edge of layer 14, since it is also covered with tungsten and gold plated, continues the low resistance path to the package ground. As described previously, the upper surface of layer 14 is tungsten plated and acts as a ground plane for RF traces 50A and 50B. Thus, the ground plane formed by the upper surface of layer 14 is solidly connected to the package ground.

As will be appreciated from the foregoing, openings 36A, 36B, tabs 46A and 46B provide a convenient reference point for determining where tungsten should be plated on the edges of layers 12 and 14.

A number of other bands are left in the tungsten coating on the edges of layers 16 and 18. These bands provide for the propagation of RF signals through the walls of the package. In particular, bands 84, 86, 88, and 90 are left with no tungsten or gold coating. These bands 84, 86, 88, and 90 are on the edges of the layers adjacent (both above and below) RF traces 50A and 50B. It should be noted that there are four more places where the edges of layer 16 and 18 are adjacent to RF traces 50A and 50B, but those places are not visible in FIG. 1. Similar bands are, nonetheless, included in those locations.

Chips 28A and 28B are then inserted into the structure. The chips are secured to base 10 using conductive epoxy or other known method. Next, the connections are made between chips 28A and 28B and chip connection pads 60A and 60B, and tungsten in holes 62A-62D, and to DC trace 32C. It should be noted that DC trace 32C can only be conveniently connected to chip 28A. However, a trace (not shown) running across chip 28A can carry the voltage level on DC trace 32C to chip 28B.

Absorber 76 is then secured inside cover 24 by any conventional means, such as gluing. Cover 24 is then brazed to seal ring 22, thereby enclosing chips 28A and 28B in an hermetically sealed package.

The package is then secured to some mounting surface, such as a cold plate. Screw recesses 78 allow a screw (not shown) to be placed very close to the package. The head of the screw can overlap flanges 80 on base 10, thereby ensuring firm mounting of the package.

DC voltage is fed to chips 28A and 28B through pins 74A-74C. RF signals are coupled to the chips through RF traces 50A and 50B. With the package assembled as described, RF traces 50A and 50B make up the center conductor of a "stripline" or "triplate" circuit in some regions and a microstrip circuit in other regions.

Figure 2:
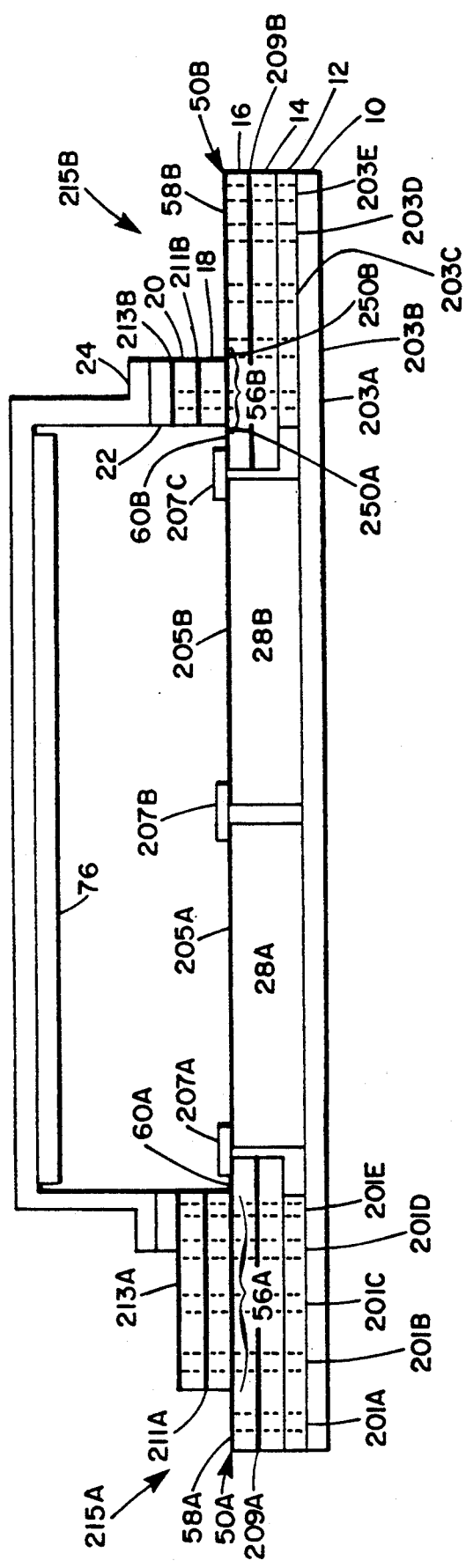
FIG. 2 is a cross-section of the package of FIG. 1 taken along the line 2—2.

The structure of these circuits can be more clearly seen by reference to FIG. 2. FIG. 2 shows a cross-section of a package made according to the invention. RF traces 50A and 50B form center conductors of striplines in regions 56A and 56B. These striplines are RF feedthroughs into the package. Ground planes 209A, 209B, 211A, and 211B are actually the tungsten coatings on layers 14 and 18 described previously. As can be seen, the thicknesses of layers 16 and 18 dictate the spacing between the conductor and the ground planes of the stripline.

Regions 50A, 50B, 60A, and 60B make up the top conductor of a microstrip circuit. The ground plane of the microstrip is formed by the tungsten coating 209A and 209B on layer 14.

It should be noted that the narrow portion 56B of RF trace 50B actually extends beyond the edges of layer 18. Hence, narrow portion 56B extends beyond the ground layer formed by tungsten coating 211B on layer 18. Thus, the portions of narrow portion 56B of RF trace 50B extending beyond layer 18 are actually a microstrip conductor with a narrower conductor than formed by regions 58B and 60B of RF trace 50B. The extent to which narrow portion 568 extends beyond layer 18 impacts the performance of the RF feedthrough and is chosen as described below.

The stripline and microstrip circuitry formed by RF traces 50A and 50B are bounded by what are effectively walls. The walls are not solid. Rather, rods 201A-201E (shown in phantom in FIG. 2) make up the back wall. Rods 201A-201E are formed by the tungsten paste filling rows of holes 34C, 34H, 34L, 34O and 34S. The front wall is made up of a similar set of rods formed by tungsten in rows of holes 34D, 34G, 34K, 34P and 34T. Rods 201A . . . 201E ensure that RF signals in the feedthrough do not affect signals on the DC traces and that noise does not affect the RF signals. Additionally, the walls prevent signals on RF traces 50A and 50B from exciting cavity modes inside ceramic layers 12-20.

The stripline and microstrip circuitry as described makes a relatively low loss feed-through the walls of the package. It should be noted that narrow portions 56A and 56B of RF traces 50A and 50B are disposed under layer 18. This positioning causes the width of RF traces 50A and 50B to change as it passes through the wall of the package. Outside of regions 56A and 56B, RF traces 50A and 50B form microstrip transmission lines. The width of RF traces 50A and 50B is selected in these regions to provide a microstrip line of a preselected impedance, commonly 50 ohms. In regions 56A and 56B, RF traces 50A and 50B form the center conductor of a stripline. In this region, the width of the RF trace is narrower to provide the preselected impedance. Thus, the change in width of RF traces 50A and 50B serves to keep a constant impedance along the waveguide. This constant impedance contributes to the low loss of the feed-through.

It should be noted, though, that the RF feedthrough formed by RF trace 50B is lower loss than that formed by RF trace 50A. First, the portion of RF trace 50B covered by layer 18 is much less than for RF trace 50A. Thus, system bonding pad 58B of RF trace 50B is much longer than system bonding pad 58A. As described above, system bonding pads 58A and 58B are gold plated. They thus have a much lower resistance than the portions of RF traces 50A and 50B covered by layer 18. Thus, RF trace 50B will have, on the aggregate, a much lower resistance than RF trace 50A.

Figure 3:
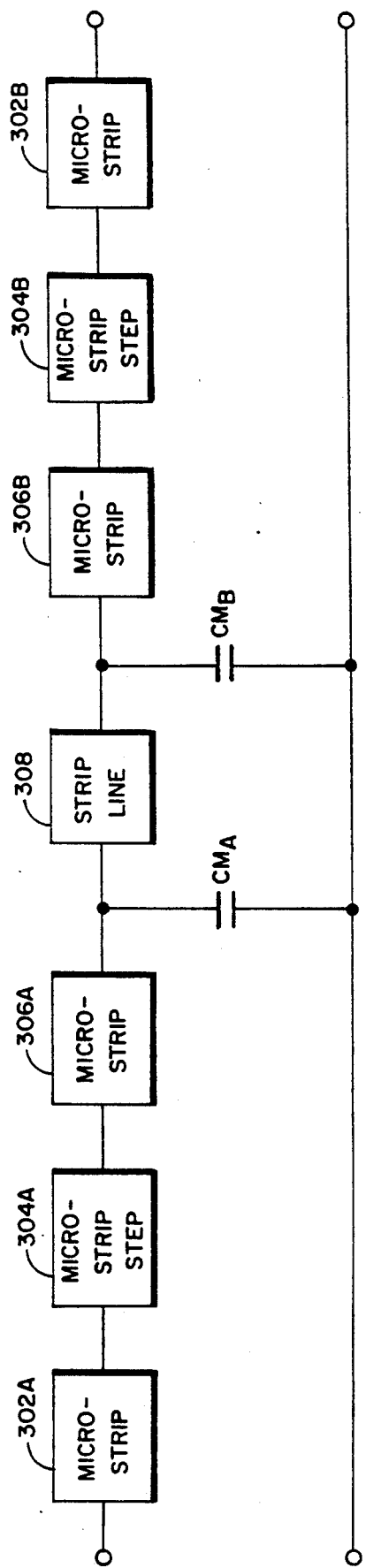
FIG. 3 is a block diagram of a model used to calculate required dimensions of the package.

Secondly, the narrow portion 50B of trace 50B extends slightly beyond layer 18 to form portions 250A and 250B. The equivalent circuit formed by this arrangement is shown in FIG. 3. System bonding pad 58B (FIG. 2) forms a microstrip, modeled as microstrip 302B. Portion 250B forms a narrower microstrip than microstrip 302B. Thus, this portion of RF trace 50B can be modeled as microstrip step from a wide to a narrow microstrip (the step may be more clearly seen in FIG. 1) followed by a section of narrow microstrip which can be modeled as microstrip 306B (FIG. 3).

Next, RF trace 50B forms a stripline where narrow portion 56B is below layer 18. The stripline can be modeled by stripline 308 (FIG. 3).

Next, portion 250A forms a microstrip circuit with a narrow conductor. This microstrip circuit is modeled as microstrip 306A.

The width of RF trace 50B then changes from narrow to wide, forming what can be modeled as microstrip step 304A. Finally, chip bonding pad 60B forms a microstrip line which can be modeled as microsrip line 302A.

It should be noted that coating 211B forms the top ground plane of the stripline. However, the coating 211B is physically close to the conductors which form microstrips 306A and 306B. Thus, there is some capacitive coupling between microstrip 306A and 306B and ground. This coupling is modeled as capacitors $CM_A$ and $CM_B$ (FIG. 3).

FIG. 3, thus, shows a model of an RF feedthrough. Computer software which computes the electrical performance of a circuit from such a model is commercially available. For example, the program Touchtone ® which can be purchased from the EESof Company of California, USA, can be used. The model of FIG. 3 is input into such a program. The length of regions 250A and 250B can be varied in the inputs to the program and the effect on the output observed. The length which optimizes performance of the feedthrough is thus selected.

For example, for a circuit operating at frequencies up to 20 Ghz, the following parameters were selected:

| | |
|---|---|
| Width of system bonding pad 58B | 14 mils |
| Width of narrow portion 56B | 5 mils |
| Length of region 250A | 6 mils |
| Length of region 250B | 6 mils |
| Length of system bonding pad 58B | 212 mils |
| Length of chip bonding pad 60B | 30 mils |
| Length of narrow portion 56B | 50 mils |
| Thickness of layers 16 and 18 | 30 mils |
| Space between trace 58B and row of holes 34I | 75 mils |

Returning again to FIG. 2, further details of the construction of the package can be seen.

Bond wire 207A connects RF trace 50A to circuit trace 205A on chip 28A. RF signals are coupled to chip 28B through bond wire 207B.

The package contains a recess 215A. This recess accommodates a connector making connection to system connection pad 58A on RF trace 50A. It should be noted that RF trace 50B is also the center conductor of a feed-through. The recess 215B is slightly larger than 215A. Recess 215B can accommodate a different shaped connector than recess 215A. Both ends of the package could, however, be the same. Alternatively, several packages of the type shown in FIG. 2 could be placed end to end. In this application, recess 215A of one package would abut recess 215B of another package, forming one large recess. The connector would fit into the larger recess.

Having described one embodiment of the invention, it will be apparent to one of skill in the art that various alternative embodiments could be constructed. The package could take on various alternative shapes. Also, other types of ceramics could be used. Also, different types of metal could be used to plate the ceramic layers or to coat the package. One of skill in the art will appreciate that the embodiment disclosed showed several ways to couple RF and DC signals to MMIC chips. Other packages could be formed using other combinations of the disclosed techniques.

It is felt, therefore, that this invention should be limited only by the spirit and scope of the appended claims.

What is claimed is:

1. A package for a circuit operating on an RF signal comprising:
   a) a first layer, said first layer having a conductive surface region;
   b) a second layer with a surface portion;
   c) a conductive trace disposed on the surface portion, said conductive trace having a wide portion and a narrow portion, said second layer being mounted above the first layer with the conductive trace above the conductive surface region of the first layer;
   d) a third layer having a conductive surface region, said third layer mounted above the second layer with the conductive surface region of the third layer above a first portion of the narrow portion of the conductive trace on the second layer wherein said narrow portion of the conductive trace on the second layer has a pair of opposing end portions and wherein said pair of opposing end portions extends beyond the third layer; and
   e) wherein the third layer, the first layer, and the first portion of the narrow portion are coupled and arranged to provide a strip transmission line and wherein the first layer, the wide portions of said conductive trace and the pair of opposing end portions are coupled and arranged to provide a microstrip transmission line.

2. The package of claim 1 wherein:
said conductive trace has two wide portions, and a narrow portion disposed between said two wide portions.

3. The package of claim 2 wherein a first one of said two wide portions of said conductive trace is disposed beyond an outside surface of a wall of the package, and a second one of said two wide portions of said conductive trace being disposed inside the package beyond an inside surface of the wall of the package.

4. The package of claim 1 wherein:
said conductive trace has a plurality of wide portions and a plurality of narrow portions, each one of said plurality of narrow portions being disposed between a different pair of the plurality of wide portions.

* * * * *